US005745258A

United States Patent [19]
Kawabata et al.

[11] Patent Number: 5,745,258
[45] Date of Patent: Apr. 28, 1998

[54] IMAGE CONTROL APPARATUS WITH A PLURALITY OF FUNCTIONAL UNITS PROVIDED ON SEPARATE PRINTED BOARDS, AND MOUNTING STRUCTURE OF THE PRINTED BOARDS

[75] Inventors: Ichiro Kawabata; Atsuo Matsunaga; Katsuaki Furui; Tomomi Ohta, all of Kawasaki, Japan

[73] Assignee: Fujitsu Limited, Kanagawa, Japan

[21] Appl. No.: 534,303

[22] Filed: Sep. 27, 1995

Related U.S. Application Data

[63] Continuation of Ser. No. 89,295, Jul. 9, 1993, abandoned.

[30] Foreign Application Priority Data

Jul. 29, 1992 [JP] Japan .................................. 4-202553
Jul. 29, 1992 [JP] Japan .................................. 4-202554

[51] Int. Cl.$^6$ ........................... H04N 1/40; H05K 7/00
[52] U.S. Cl. ........................ 358/444; 361/735; 361/792
[58] Field of Search ........................... 395/280–282, 395/828, 829, 882, 883, 892–894; 361/728–730, 735–737, 748, 784, 790, 792, 796, 803, 679, 683, 686; 439/66, 74, 405, 591; 358/444; 370/241

[56] References Cited

U.S. PATENT DOCUMENTS

| | | | |
|---|---|---|---|
| 3,459,998 | 8/1969 | Focarile | 439/74 |
| 3,832,603 | 8/1974 | Cray et al. | 361/790 |
| 4,106,076 | 8/1978 | Miller et al. | 361/784 |
| 4,133,592 | 1/1979 | Cobaugh et al. | 439/74 |
| 4,571,663 | 2/1986 | McPherson | 361/784 |
| 4,683,550 | 7/1987 | Jindrick et al. | 361/683 |
| 4,688,864 | 8/1987 | Sorel | 361/735 |
| 4,733,461 | 3/1988 | Nakano | 361/803 |
| 4,838,798 | 6/1989 | Evans et al. | 439/61 |
| 4,860,247 | 8/1989 | Uchida et al. | |
| 4,929,185 | 5/1990 | Wong et al. | 439/74 |
| 4,942,550 | 7/1990 | Murray | 395/282 |
| 5,013,249 | 5/1991 | Lindeman et al. | 439/74 |
| 5,021,892 | 6/1991 | Kita et al. | 358/444 |
| 5,121,295 | 6/1992 | Lam | 361/736 |
| 5,121,297 | 6/1992 | Haas | 361/792 |
| 5,201,038 | 4/1993 | Fielder | 395/280 |
| 5,202,965 | 4/1993 | Ahn et al. | 36/784 |
| 5,259,784 | 11/1993 | Iwatare et al. | 361/788 |
| 5,260,854 | 11/1993 | Hileman et al. | 361/736 |
| 5,309,568 | 5/1994 | Ghosh et al. | 395/325 |
| 5,457,784 | 10/1995 | Wells et al. | 395/829 |
| 5,483,518 | 1/1996 | Whetsel | 370/241 |
| 5,493,415 | 2/1996 | Mita | 358/444 |

FOREIGN PATENT DOCUMENTS

0425192  5/1991  European Pat. Off. .

Primary Examiner—Steven Saras
Attorney, Agent, or Firm—Helfgott & Karas, P.C.

[57] ABSTRACT

An image control apparatus includes a communication control unit for effecting a communication with the outside of the apparatus, an image processing control unit for controlling processings required for a given image data, and a main control unit for controlling the communication control unit and the image processing control unit. Respective control units are provided on separate printed boards, respectively, and each printed board is connected to each other using respective connectors. By the constitution, it is possible to make a maximum use of resources such as hardware resources and thereby improve an efficiency in development of the image control apparatus. Also, by mounting the above printed boards with being divided into lower-side units and upper-side units, it is possible to increase the component mounting space and to have the printed board drawings for common use.

21 Claims, 10 Drawing Sheets

IMAGE CONTROL APPARATUS WITH A PLURALITY OF FUNCTIONAL UNITS PROVIDED ON SEPARATE PRINTED BOARDS, AND MOUNTING STRUCTURE OF THE PRINTED BOARDS

This is a continuation, of application Ser. No. 08/089,295, filed Jul. 9, 1993 now abandoned.

BACKGROUND OF THE INVENTION

1. Field of the Invention

The present invention relates to an image control apparatus for effecting an image processing to thereby control an apparatus which treats image data (hereinafter referred to as an image apparatus). More particularly, the invention relates to an image control apparatus (image controller) with a plurality of functional units provided on separate printed boards, and a mounting structure of the printed boards.

2. Description of the Related Art

A typical image apparatus such as a printer, a copying machine, a facsimile, a display apparatus, or the like, is provided with an image control apparatus for controlling a printer engine or the like. Such an image control apparatus effects a communication with an external apparatus such as a host computer, and processes image data to control a printer engine or the like.

Recently, an image control apparatus such as a controller for a printer has been demanded to realize a serial or grouping of a low-speed machine, a medium-speed machine, or a high-speed machine required for the printer, by an identical architecture. To this end, it is demanded to efficiently employ enormous firmware resources and hardware resources to thereby develop such an image control apparatus.

Conventionally, where the above serial or grouping of an image controller is carried out using an identical architecture, a number of functions has been added to the image controller. This is directed to an improvement in the performance of a part of the image controller or a distinction from other controllers. For example, with respect to a high-speed image controller, the function of communication is added thereto. Conversely, with respect to a low-speed image controller, the function of communication is removed therefrom.

As described later in detail, however, the prior art image controller poses a number of problems.

For example, where the function of a part of the controller is changed or another function is added thereto, it becomes necessary to re-develop the entire controller. Also, with the requirement for a high speed operation, the hardware of the image controller must employ high speed elements. In this case, there appears influences by noises, electric waves, static electricity, or the like. To cope with this, it becomes necessary to fully take into consideration the LSI designing, the pattern designing, and the like. This leads to an increase in labor for development and a lowering in an efficiency of the development.

On the other hand, the above image controller is constituted by a plurality of functional units, and each unit is generally mounted on separate printed boards, respectively. In this case, where the mounting space of respective printed boards is small, a mounting structure in which the printed boards are arranged in a hierarchical form is effective. In a typical example, coupling fittings are provided on a lower printed board to thereby connect the lower printed board to an upper printed board (i.e., to support the upper printed board).

In a known mounting structure, the printed board mounting a basic unit thereon requires connectors to be provided along side end portions thereof. This is because the basic unit needs to be connected to external devices such as an operation panel, a floppy disk drive unit, or the like, and because it is used for connections of various communications. Accordingly, with respect to the basic unit, the coupling fittings must be provided inwardly from the side surface of the printed board, by a region corresponding to the occupation area of the connectors. Also, the size of the lower printed board differs from that of the upper printed board.

As a result, the prior art mounting structure poses a number of problems.

First, since the coupling fittings are provided inwardly by the predetermined region from the side surface of the printed board, the mounting space for components such as LSIs is accordingly reduced. Also, since the sizes of the lower printed board and the upper printed board are different from each other, it is necessary to draft the printed board drawings individually for each of the printed boards used therein. This leads to an increase in the cost and labor for designing.

Note, the problems in the prior art will be explained later in detail in contrast with the preferred embodiments of the present invention.

SUMMARY OF THE INVENTION

An object of the present invention is to provide an image control apparatus which can make a maximum use of resources such as hardware resources and thereby improve an efficiency in development thereof.

Another object of the present invention is to provide a mounting structure of the printed boards mounting respective functional units of the above image control apparatus thereon, by which it is possible to increase the component mounting space and to have the printed board drawings for common use.

According to one aspect of the present invention, there is provided an image control apparatus including: a communication control unit for effecting a communication with the outside of the apparatus; an image processing control unit for controlling processings required for a given image data; and a main control unit for controlling the communication control unit and the image processing control unit; the main control unit, the communication control unit and the image processing control unit being provided on separate printed boards, respectively, and each printed board being connected to each other using respective connectors.

Also, according to another aspect of the present invention, there is provided a mounting structure of printed boards on each of which one of a plurality of functional units constituting an image control apparatus is provided, the mounting structure including: a lower-side unit including at least one printed board on which one of the plurality of functional units is mounted, the at least one printed board having a first connector and a plurality of through-holes provided along an end portion thereof; an upper-side unit including at least one printed board on which another one of the plurality of functional units is mounted, the at least one printed board having a second connector connectable to the first connector and a plurality of through-holes provided along an end portion thereof; and coupling fittings for coupling the lower-side unit to the upper-side unit, the coupling fittings having a plurality of holes for getting screws to fit thereinto; the plurality of holes of the coupling fittings being formed at positions corresponding to the respective through-holes provided in each printed board of the lower-side unit and the upper-side unit, and when the lower-side unit and the upper-side unit are connected to each other by the first and second connectors, the screws being fit into the plurality of holes of the coupling fittings via the respective through-holes from the outside of each printed board of the lower-side unit and the upper-side unit.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Throughout the description, identical references used in connection with the drawings indicate like constituent elements, and thus the repetition of explanation thereof is omitted.

First, for a better understanding of the preferred embodiment of the present invention, the related prior art will be explained with reference to FIG. 1.

Figure 1:
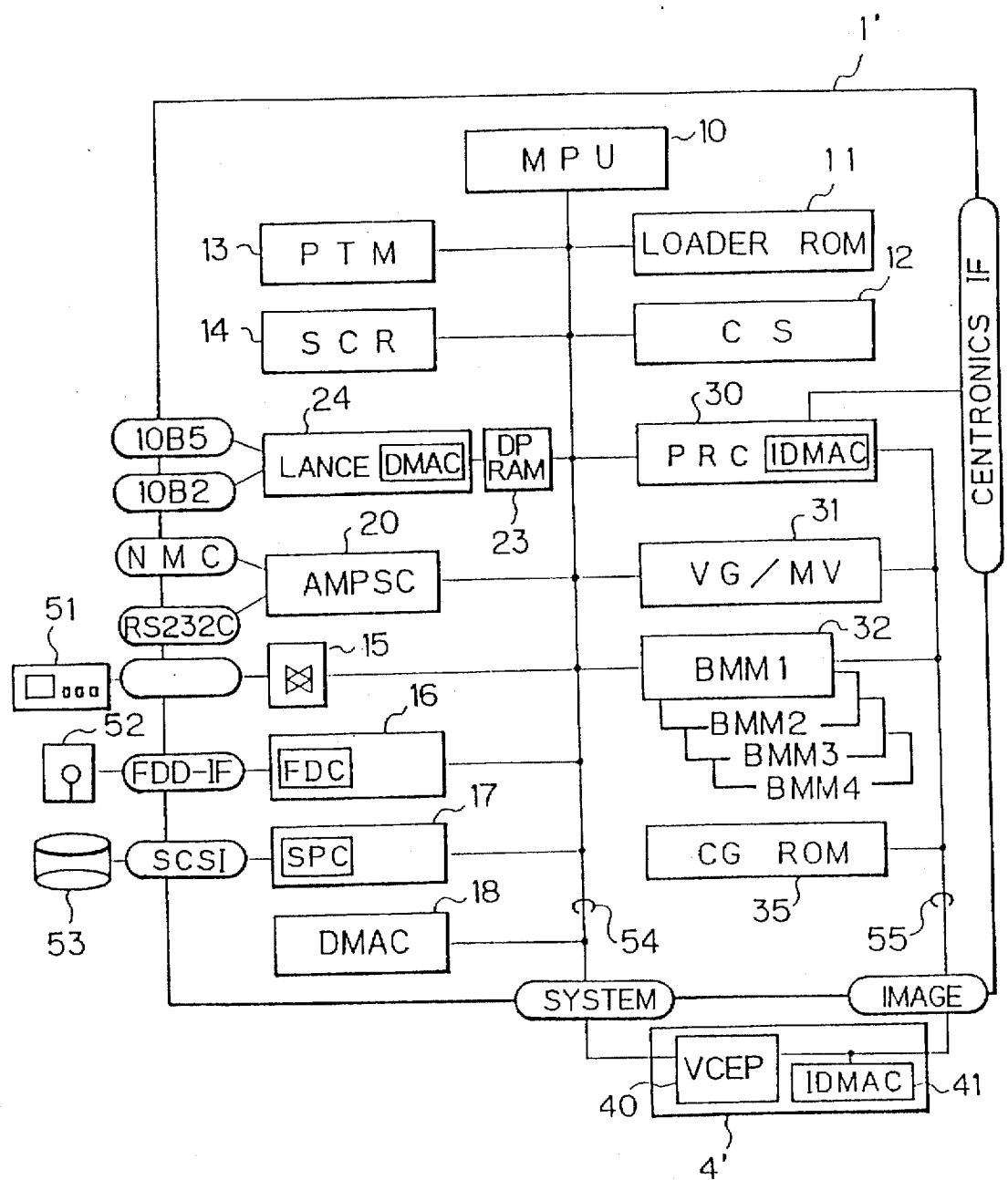
FIG. 1 is a block diagram showing a constitution of a prior art image control apparatus (controller for a printer)

FIG. 1 illustrates a constitution of a prior art image control apparatus. The illustration shows a controller for a printer.

In the illustration, reference 1' denotes a basic unit constituted in the form of a single printed board. The basic unit 1' includes a processor (MPU) 10 for effecting a main control of the printer, a loader ROM 11 for data-loading, a control storage (CS) 12, a programmable timer circuit (PTM) 13, a system control register (SCR) 14, a dual-port RAM (DPRAM) 23 for communication, a LAN (local area network) controller (LANCE) 24 for the LAN communication such as Ethernet, Cheapernet, or the like, and a multi-protocol controller (AMPSC) 20 for the communication such as RS232C, or the like.

The basic unit 1' also includes a driver/receiver 15 for an operation panel 51, a controller (FDC) 16 for a floppy disk drive unit 52, a controller (SPC) 17 for a hard disk drive unit 53, a direct memory access controller (DMAC) 18, a printer control circuit (PRC) 30, a vector generator/mover circuit (VG/MV) 31, a bit map memory (BMM) 32, and a character generator ROM (CGROM) 35. Respective circuit units included in the basic unit 1' are connected via a system bus 54 and/or an image bus 55 to each other.

Also, reference 4' denotes an image processing unit provided as an option, which includes a video compression/expansion circuit (VCEP) 40 and an image direct memory access controller (IDMAC) 41. The video compression/expansion circuit 40 and the image direct memory access controller 41 are connected to the system bus 54 and the image bus 55.

Conventionally, where the serial or grouping of an image controller as described above is carried out using an identical architecture, a number of functions has been added to the image controller for the purpose of an improvement in the performance of a part of the image controller or a distinction from other controllers, and thus the controller has been developed.

For example, with respect to a low-speed image controller, the function of communication is removed therefrom, and with respect to a high-speed image controller, the function of communication is added thereto. Namely, the image controller is required to have a high speed performance with respect to the image development in the printer control, according to the increase in a processing speed thereof.

According to the above prior art, however, a number of problems occur in the points below.

Since the basic unit 1' is constituted in the form of a single printed board, it is necessary to re-develop the entire controller where the function of a part of the controller is changed or another function is added thereto.

With the requirement for a high speed operation of the image apparatus, the hardware of the image controller also employs high speed elements. Accordingly, to cope with influences by noises, electric waves, static electricity, or the like, it becomes necessary to fully take into consideration the LSI designing, the pattern designing, the mounting of components or elements, the frame ground processings, and the like. Namely, since good attention must be paid to the printed board designing, it is necessary to re-design the printed boards.

Due to the above problems, labor for development is increased and thus an efficiency in the development is lowered.

Figure 2:
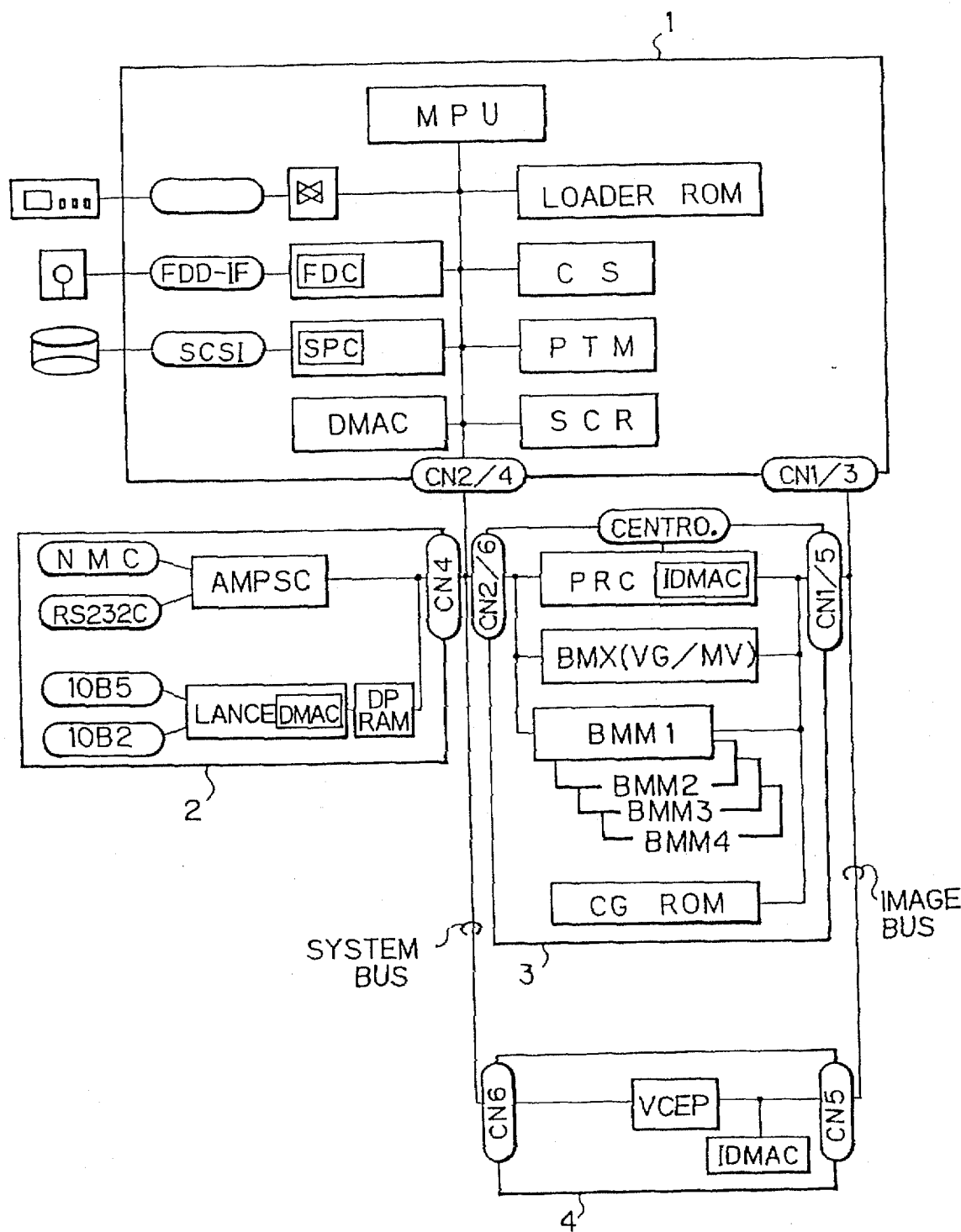
FIG. 2 is a block diagram showing the fundamental constitution of the image control apparatus according to the present invention.

FIG. 2 illustrates the fundamental constitution of the image control apparatus according to the present invention.

In the illustration, reference 1 denotes a main control unit for the image control; reference 2 denotes a communication control unit for effecting a communication with the outside of the apparatus; reference 3 denotes a development unit for developing a given image data; and reference 4 denotes an image processing unit for processing the given image data. Respective units 1 to 4 are provided on separate printed boards, respectively, and each printed board is connected to each other using respective connectors.

According to the illustrated constitution, the image control apparatus (image controller) is divided into four functional units depending upon the contents of the function thereof. In the illustrated example, the function of the image controller is divided into four parts, i.e., the main control (1), the communication control (2), the image development (3), and the image processing (4). Among these parts, the communication control unit 2, the development unit 3 and the image processing unit 4 have a relatively high possibility of a change of the function, respectively. Thus, each functional unit is classified into a block having a higher possibility of a change of the function, or a block having a lower possibility thereof. Namely, by effecting the division of the function of the controller, the serial or grouping of the hardware is realized.

Therefore, by mounting each of the units 1 to 4 on separate printed boards, respectively, and connecting each printed board to each other using respective connectors, it is possible to prevent a change or an addition of the function of a part of the image controller from influencing other parts thereof. Accordingly, where the serial or grouping of the image controller is carried out, it is possible to effectively develop the controller with a minimum change in the designing. This contributes to an improvement in an efficiency of the development.

Also, since it is not necessary to change each printed board, it is possible to greatly save time and labor for the printed board designing.

Next, the preferred embodiment of the present invention will be explained with reference to FIGS. 3, 4A and 4B.

Figure 3:
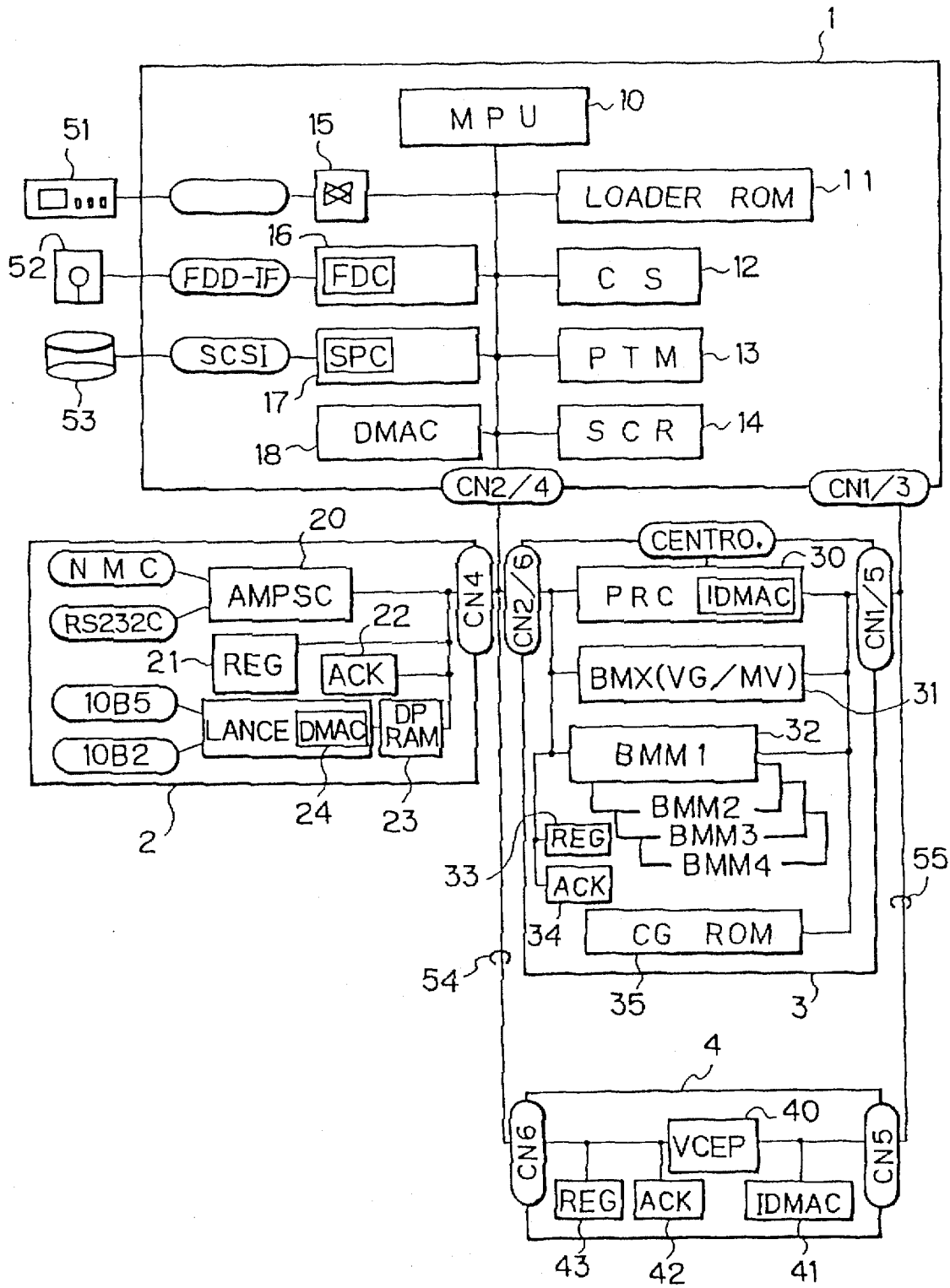
FIG. 3 is a block diagram showing a constitution of the image control apparatus (controller for a printer) according to an embodiment of the present invention.
Figure 4A:
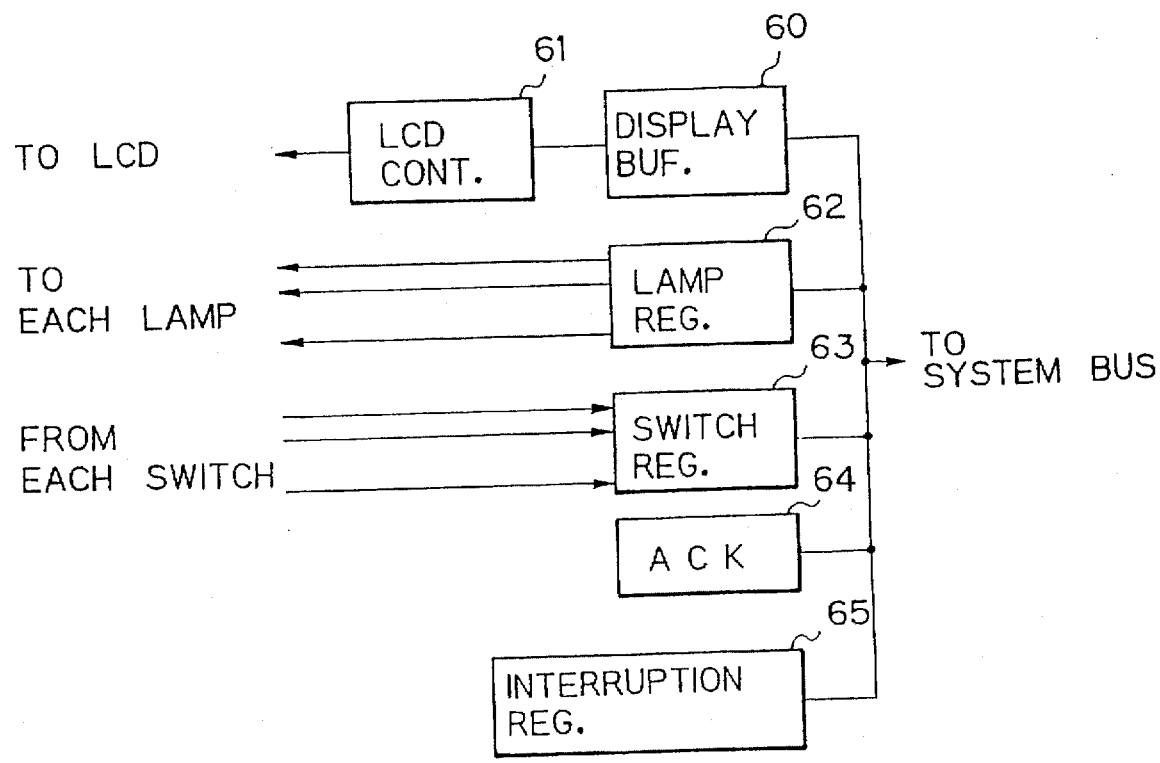
FIGS. 4A and 4B are block diagrams showing constitutions of the main parts in the constitution of FIG. 3.

FIG. 3 illustrates a constitution of the image control apparatus according to an embodiment of the present invention. The illustration shows a controller for a printer.

In FIG. 3, the main control unit 1 is mounted on a single printed board. The main control unit 1 includes a main processor 10 having an extremely low possibility of a change of the function thereof, a loader ROM 11, a control storage 12, a programmable timer circuit 13, a system control register 14, an operation panel driver/receiver 15, a floppy disk controller 16, a hard disk controller 17, and a direct memory access controller 18. Respective circuit units are connected to a system bus 54.

Similarly, the communication control unit 2 is also mounted on a single printed board. The communication control unit 2 includes a multi-protocol controller 20, a control register (REG) 21, an acknowledgement circuit (ACK) 22 for sending an acknowledgement signal back to the main control unit 1, a dual-port RAM 23, and a LAN controller 24. Respective circuit units are connected to the system bus 54.

Similarly, the development unit 3 is also mounted on a single printed board. The development unit 3 includes a printer control circuit 30 connected via Centronics interface to a printer engine (not shown), a vector generator/mover circuit 31, a bit map memory 32, a control register (REG) 33, an acknowledgement circuit (ACK) 34 for sending an acknowledgement signal back to the main control unit 1, and a character generator ROM 35. Respective circuit units are connected to the system bus 54 and an image bus 55.

Similarly, the image processing unit 4 is also mounted on a single printed board. The image processing unit 4 includes a video compression/expansion circuit 40, an image direct memory access controller 41, an acknowledgement circuit (ACK) 42 for sending an acknowledgement signal back to the main control unit 1, and a control register (REG) 43. Respective circuit units are connected to the system bus 54 and the image bus 55.

The main control unit 1 and the communication control unit 2 are connected via respective connectors CN4 to the system bus 54. Similarly, the main control unit 1 and the development unit 3 are connected via respective connectors CN2 to the system bus 54, and connected via respective connectors CN1 to the image bus 55. Also, the development unit 3 and the image processing unit 4 are connected via respective connectors CN6 to the system bus 54, and connected via respective connectors CN5 to the image bus 55.

Thus, since the image controller is divided into four functional units (i.e., the main control unit 1 with programs and constitution related to the main control, the communication control unit 2 for controlling a communication with the outside of the image controller, the development unit 3 for developing image data such as characters, and the image processing unit 4 for controlling compression or expansion of the image data), each unit is brought to a "closed" state, respectively. Accordingly, even if a change of the function is carried out with respect to each unit, the influence thereby is confined to the unit concerned, and thus is not exerted on other parts.

Also, since each unit is provided as an interface to the system bus 54 of the main control unit 1, it is possible to reduce a change of the main control unit 1 to the minimum even if the function of each unit is changed.

Furthermore, a response time (or acknowledgement time) to the main control unit 1 varies depending on a change of the function of each unit. Accordingly, where an acknowledgement circuit is provided in the main control unit 1, it becomes necessary to change the main control unit 1 every time the function of each unit is changed. To cope with this, in the present embodiment, the communication control unit 2, the development unit 3 and the image processing unit 4 are provided with the acknowledgement circuits 22, 34 and 42, respectively. Thus, with respect to changes of the respective functions of the units 2 to 4, it becomes unnecessary to change the main control unit 1.

Similarly, the number of control registers is also changed depending on a change of the function of each unit. Accordingly, in the present embodiment, the communication control unit 2, the development unit 3 and the image processing unit 4 are provided with the control registers 21, 33 and 43, respectively. Thus, with respect to changes of the respective functions of the units 2 to 4, it becomes unnecessary to change the main control unit 1.

On the other hand, the operation panel 51 has a higher possibility of a change of the function thereof where the serial or grouping of the image controller is carried out, from a viewpoint of the distinction from other image controllers. Accordingly, where the operation panel 51 is changed, it is necessary to provide the operation panel 51 as an interface which exerts no influence on the main control unit 1.

As changes related to the operation panel 51, there are a change in the size of a liquid crystal display (LCD), a change in the number of switches, a change in the number of lamps, a change in the number of buzzers, and the like. Accordingly, in the present embodiment (see FIG. 4A), the operation panel 51 includes a LCD controller 61, a display buffer 60, various registers (a lamp register 62, a switch register 63, and an interruption register 65), and an acknowledgement circuit 64.

Figure 4B:
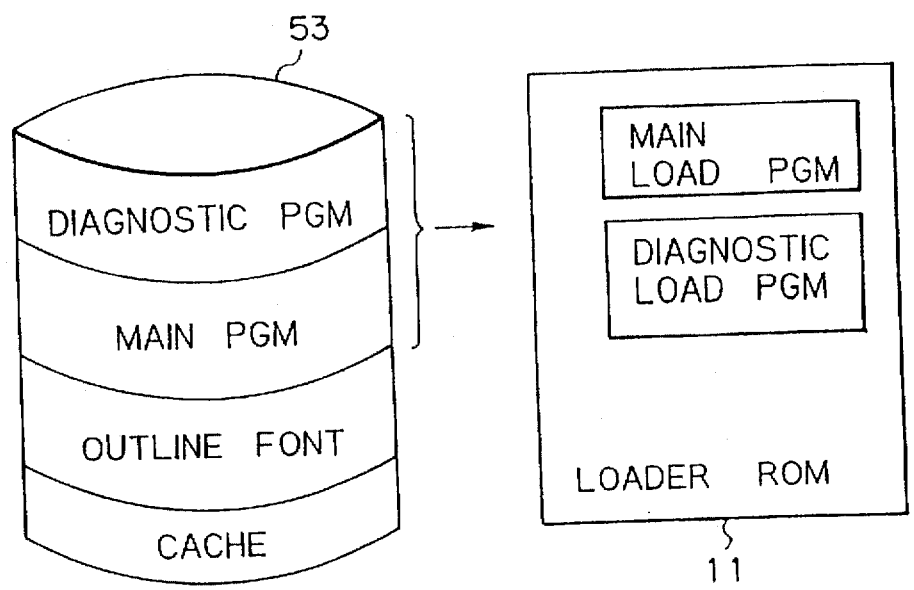

Also, as shown in FIG. 4B, the loader ROM 11 stores only load programs for a main program and a diagnostic program installed in the hard disk. Accordingly, even if the printed boards (2, 3, 4) connected to the main control unit 1 are changed, it is possible to prevent any influence by the change from being exerted on the main control unit 1.

Furthermore, since the development unit 3 and the image processing unit 4, each having a relatively high possibility of a change of the function thereof, are provided on separate printed boards, respectively, it is possible to realize the serial or grouping of the image controller by changing the units 3, 4 alone.

Next, the mounting structure of the printed boards constituting the image control apparatus shown in FIG. 2 will be explained with reference to FIGS. 5A to 10C.

In the like manner, the related prior art will be explained with reference to FIGS. 5A to 5C.

Figure 5A:
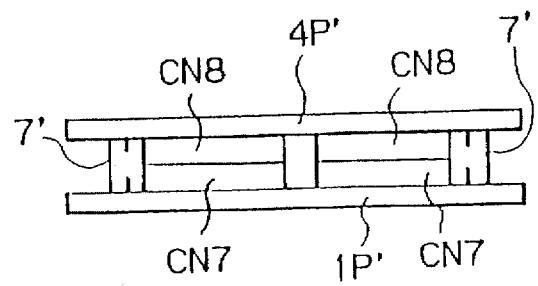
FIGS. 5A to 5C are views showing a prior art mounting structure of the printed boards constituting an image control apparatus (controller for a printer)
Figure 5B:
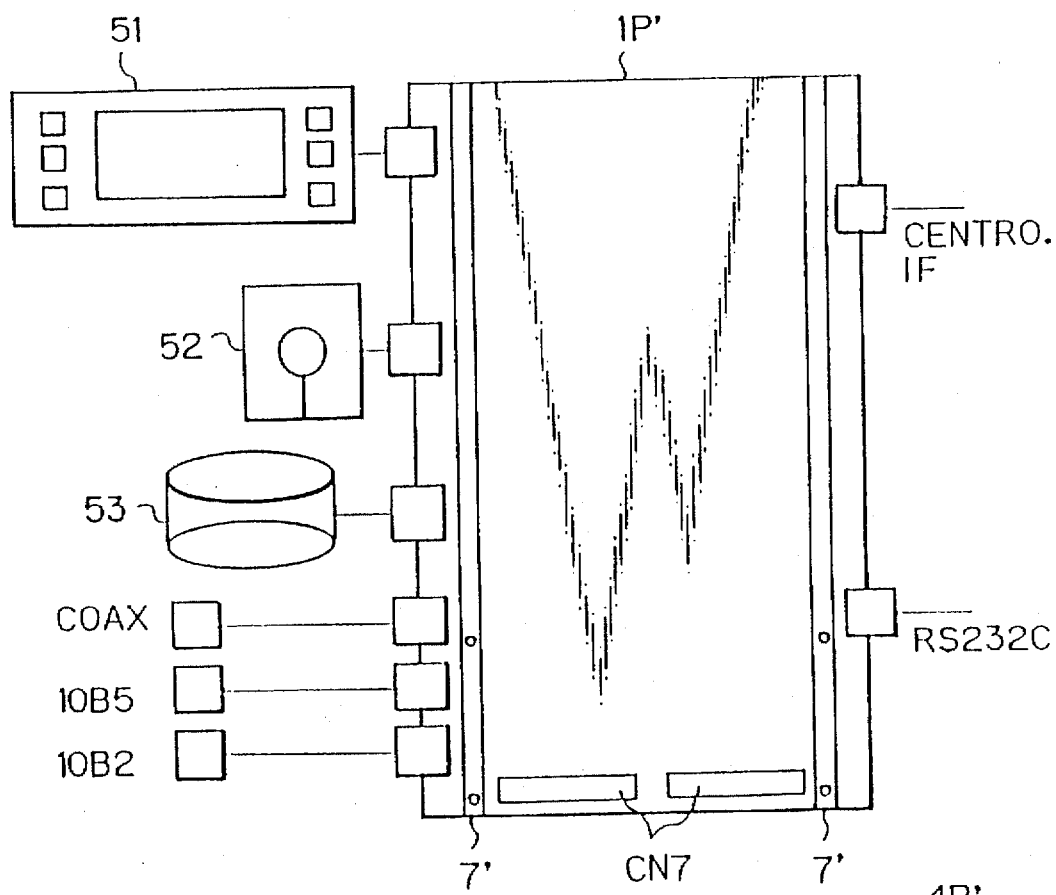
Figure 5C:
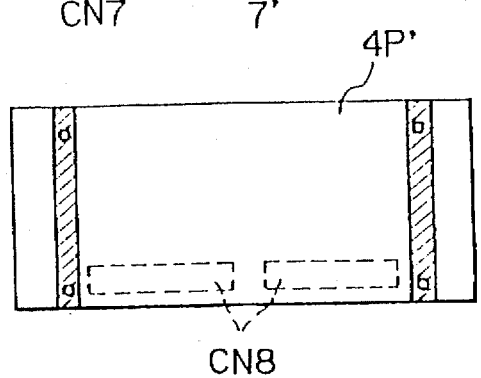

FIGS. 5A to 5C illustrate a prior art mounting structure of the printed boards constituting an image control apparatus. The illustration shows a controller for a printer.

In the prior art mounting structure (see FIG. 5A), a lower printed board 1P' (see FIG. 5B) mounting the basic unit of the image controller thereon supports an upper printed board 4P' (see FIG. 5C) mounting the image processing unit thereon, by means of coupling fittings 7' provided on the lower printed board 1P'. Also, the lower printed board 1P' and the upper printed board 4P' are connected to each other using respective connectors CN7 and CN8.

As shown in FIG. 5B, the lower printed board 1P' (the basic unit) requires connectors to be provided along side end portions thereof. This is because the basic unit needs to be connected to the operation panel 51, the floppy disk drive unit 52 and the hard disk drive unit 53, and because it is used for connections of an ordinary communication (COAX), a LAN communication (10B5, 10B2) such as Ethernet, RS232C, and Centronics interface. Accordingly, in the lower printed board 1P' (the basic unit), the coupling fittings 7' must be provided inwardly from the side surface of the printed board, by a region corresponding to the occupation area of the connectors. As a result, the size of the lower printed board 1P' differs from that of the upper printed board 4P'.

According to the above prior art, a number of problems occur in the points below.

Since the coupling fittings 7' are provided inwardly by the predetermined region from the side surface of the printed board, the mounting space for components such as LSIs in the basic unit is accordingly reduced.

Also, since the size of the lower printed board 1P' is different from that of the upper printed board 4P', it is necessary to draft the printed board drawings individually for both the lower printed board and the upper printed board, and thus this is troublesome. This leads to an increase in the cost and labor for designing.

Figure 6A:
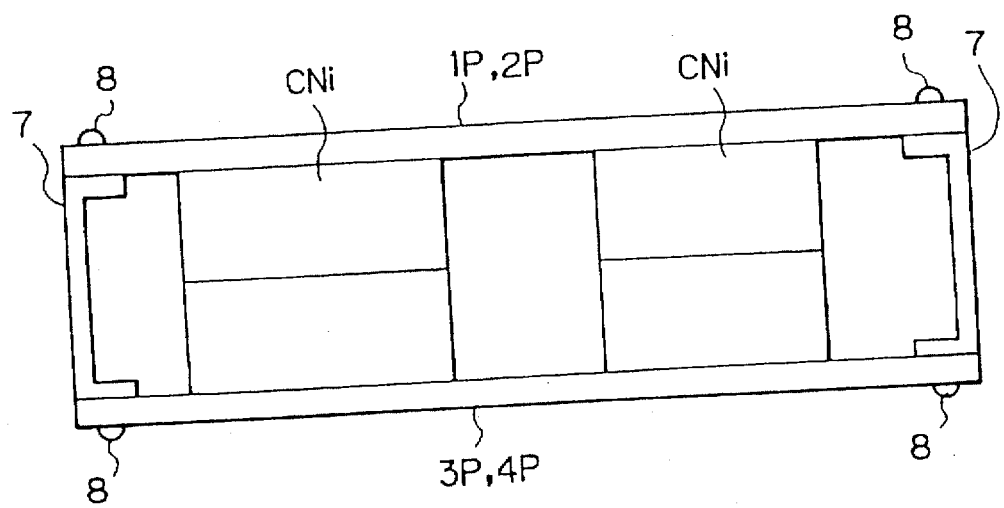
FIGS. 6A and 6B are views showing the fundamental mounting structure of the printed boards constituting the image control apparatus shown in FIG. 2.
Figure 6B:
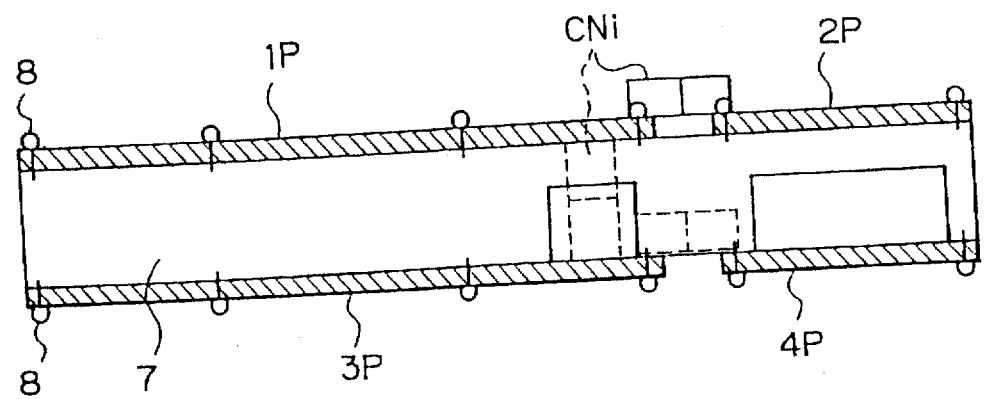

FIGS. 6A and 6B illustrate the fundamental mounting structure of the printed boards constituting the image control apparatus shown in FIG. 2.

The mounting structure includes: a lower-side unit including at least one printed board 3P, 4P on which one of the plurality of functional units is mounted, the at least one printed board having a first connector and a plurality of through-holes provided along an end portion thereof; an upper-side unit including at least one printed board 1P, 2P on which another one of the plurality of functional units is mounted, the at least one printed board having a second connector connectable to the first connector and a plurality of through-holes provided along an end portion thereof; and coupling fittings 7 for coupling the lower-side unit to the upper-side unit, the coupling fittings having a plurality of holes for getting screws 8 to fit thereinto. The plurality of holes of the coupling fittings 7 are formed at positions corresponding to the respective through-holes provided in each printed board 1P, 2P, 3P, 4P of the lower-side unit and the upper-side unit, and when the lower-side unit and the upper-side unit are connected to each other by the first and second connectors, the screws are fit into the plurality of holes of the coupling fittings 7 via the respective through-holes from the outside of each printed board 1P, 2P, 3P, 4P of the lower-side unit and the upper-side unit.

According to the illustrated mounting structure, since the coupling fittings 7 are provided along the respective end portions of the lower-side printed boards 3P, 4P and the upper-side printed boards 1P, 2P, it is possible to relatively increase the component mounting space in each printed board, and the wirings are also facilitated.

Also, since the through-holes for getting the screws 8 thereinto are provided at the positions corresponding to each other in the lower-side printed board 3P, 4P and the upper-side printed board 1P, 2P (i.e., since the size of the lower-side printed board is the same as that of the upper-side printed board), it is possible to have the printed board drawings for common use with respect to both the lower-side printed board 3P, 4P and the upper-side printed board 1P, 2P. This contributes to an improvement in the efficiency of designing.

Next, the preferred embodiment of the present invention will be explained with reference to FIGS. 7 to 10C.

Figure 7:
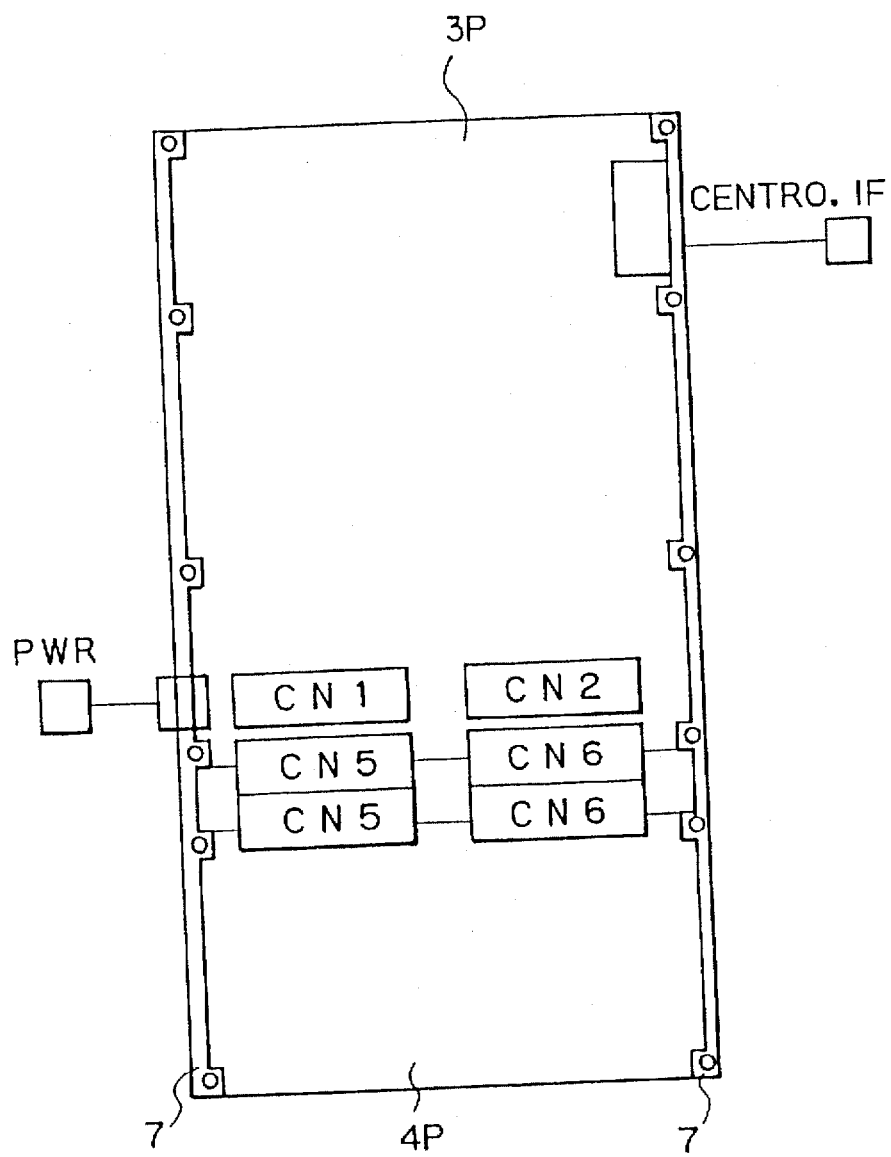
FIG. 7 is a plan view schematically showing a constitution of the lower-side unit in the mounting structure according to an embodiment of the present invention.
Figure 8:
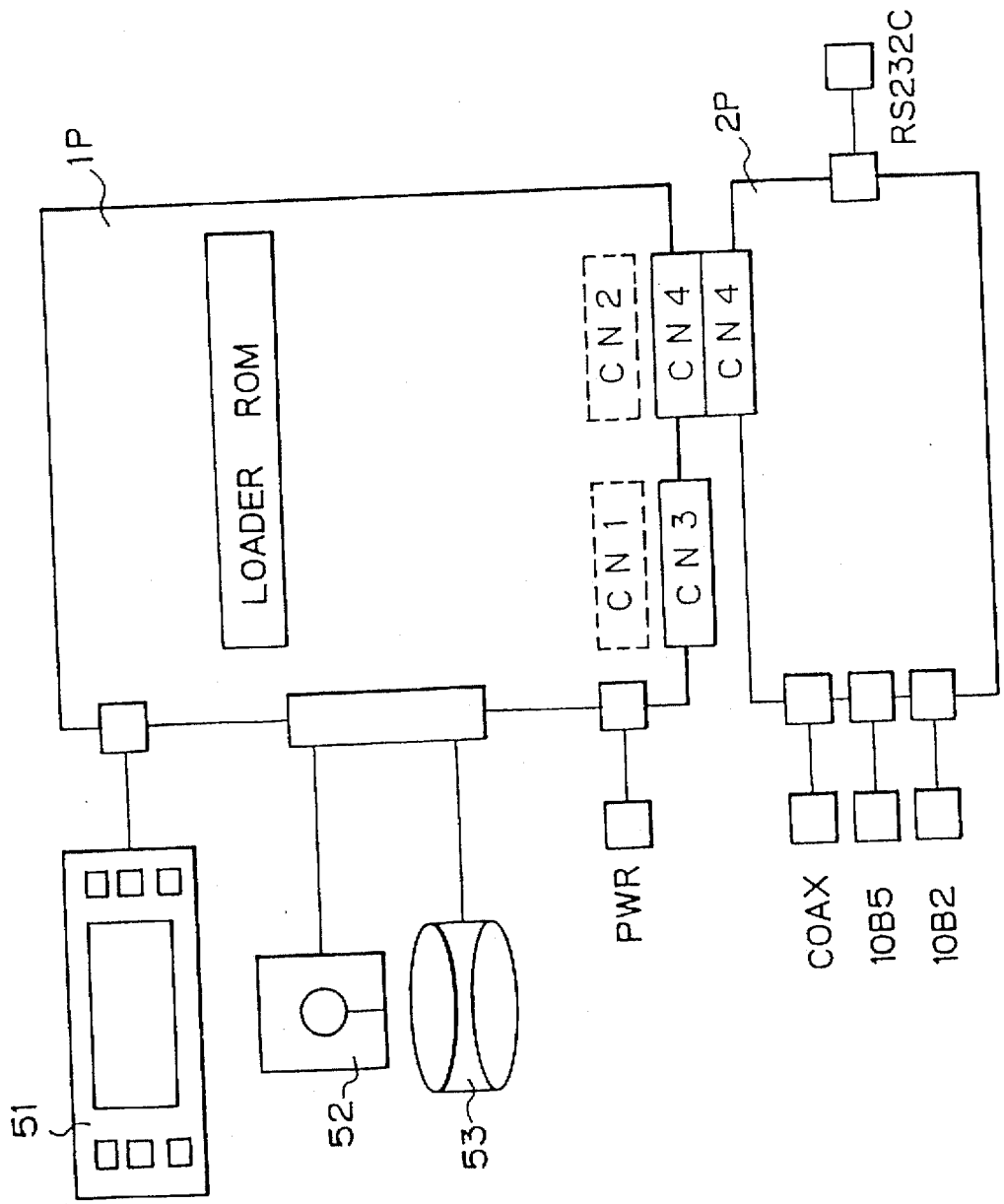
FIG. 8 is a plan view schematically showing a constitution of the upper-side unit corresponding to the lower-side unit shown in FIG. 7.

FIG. 7 schematically illustrates a constitution of the lower-side unit in the mounting structure according to an embodiment of the present invention, and FIG. 8 schematically illustrates a constitution of the upper-side unit corresponding to the lower-side unit shown in FIG. 7.

In FIG. 7, the lower-side unit includes a printed board 3P mounting the development unit for developing image data such as characters or graphics thereon, and a printed board 4P mounting the image processing unit for effecting compression or expansion of the image data thereon. The printed boards 3P and 4P are connected to each other using respective connectors CN5 and CN6. Also, the coupling fittings 7 are provided along the respective end portions of the printed boards 3P and 4P.

The printed board 3P (the development unit) is provided with a connector for power supply (PWR) in the left side thereof, and a connector for Centronics interface in the right side thereof. The printed board 3P is also provided with connectors CN1 and CN2 for connection to the upper-side printed board 1P.

In FIG. 8, the upper-side unit includes a printed board 1P mounting the main control unit for effecting the main control for the printer thereon, and a printed board 2P mounting the communication control unit for controlling a communication such as RS232C and a LAN communication thereon. The printed boards 1P and 2P are connected to each other using respective connectors CN4.

The printed board 1P (the main control unit) is provided with a connector for connection to the operation panel 51, a connector for connection to the floppy disk drive unit 52, a connector for connection to the hard disk drive unit 53, a connector for power supply (PWR), connectors CN1 and CN2 for connection to the lower-side printed board 3P, and a connector CN3.

Also, the printed board 2P (the communication control unit) is provided with a connector used for coaxial communication (COAX), a connector used for Ethernet communication (10B5), a connector used for Cheapernet communication (10B2), and a connector used for RS232C communication.

The size and shape of the lower-side printed board 3P are the same as those of the upper-side printed board 1P. Also, the through-holes for getting screws thereinto in the lower-side printed board 3P are provided at the same positions as those in the upper-side printed board 1P.

Similarly, the size and shape of the lower-side printed board 4P are the same as those of the upper-side printed board 2P. Also, the through-holes for getting screws thereinto in the lower-side printed board 4P are provided at the same positions as those in the upper-side printed board 2P.

Figure 9:
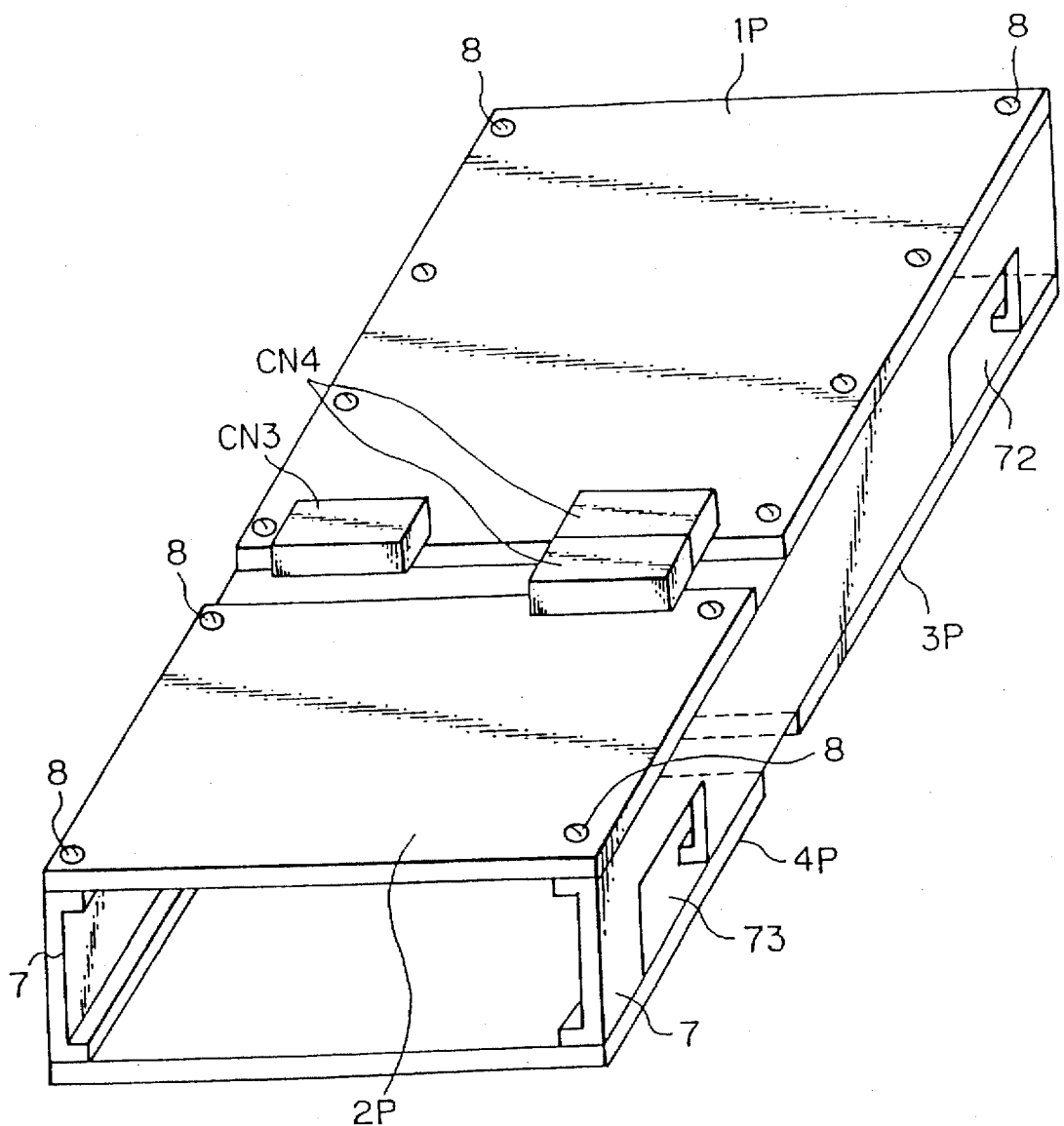
FIG. 9 is a perspective view showing a completion body by a combination of the lower-side unit and the upper-side unit shown in FIGS. 7 and 8.

FIG. 9 illustrates a completion body by a combination of the lower-side unit and the upper-side unit.

Figure 10A:
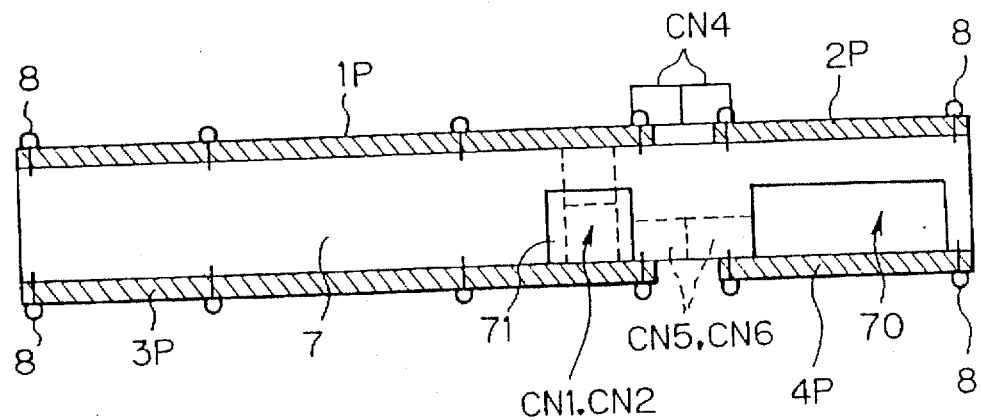
FIGS. 10A to 10C are side and front views of the completion body shown in FIG. 9.
Figure 10B:
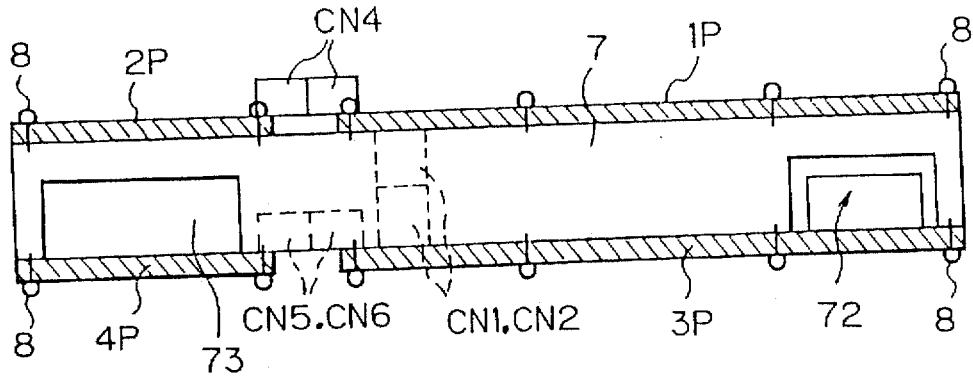
Figure 10C:
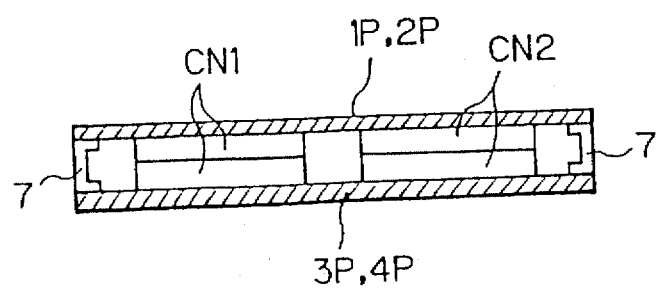

Also, FIG. 10A illustrates a side view seen from the left side of the completion body shown in FIG. 9; FIG. 10B illustrates a side view seen from the right side thereof; and FIG. 10C illustrates a front view thereof. The illustrated completion body is constituted by fitting the screws 8 into the holes of the coupling fittings 7 via the corresponding through-holes from the outside of each of the lower-side printed boards 3P, 4P and the upper-side printed boards 1P, 2P, and thereby fixing the printed boards 1P, 2P, 3P and 4P to the coupling fittings 7.

By the constitution, the connectors CN1, CN2 provided on the upper-side printed board 1P are connected to the connectors CN1, CN2 provided on the lower-side printed board 3P, as shown in FIG. 10C.

Also, the coupling fitting 7 in the left side is provided with an opening 70 for communication and an opening 71 for a power supply connector of the development unit 3P (see FIG. 10A), and the coupling fitting 7 in the right side is provided with an opening 72 for a Centronics interface connector of the development unit 3P and an opening 73 for communication (see FIG. 10B).

Such a constitution appears to make it difficult to examine presence or absence of any fault in the lower-side printed board 4P. However, it is possible to effect the examination of fault by detaching the lower-side printed board 4P (image processing unit) and exchanging the same for the upper-side printed board 2P (communication control unit). This is because the image processing unit (printed board 4P) is connected via the connectors CN6 and CN4 to the upper-side main control unit (printed board 1P), and because the connector CN5 of the image processing unit is connected to the connector CN3 of the main control unit (see FIGS. 7, 8) and thus the image processing unit is connected via the connector CN1 and the image bus 55 (see FIG. 3) to the lower-side development unit (printed board 3P).

In this case, although the communication control unit (printed board 2P) is disposed in the lower-side, connectors for communication can be connected through the openings 70, 73 of the coupling fitting 7 to the communication control unit.

Thus, in the mounting structure in which the printed boards 1P, 2P, 3P and 4P are arranged in a hierarchical form, it is possible to increase the component mounting space by the specific arrangement of the coupling fittings 7, and the wirings can be also facilitated.

Also, since the upper-side printed boards and the lower-side printed boards are connected to each other using the respective connectors, it is possible to reduce the wiring length and to effect a high speed processing, compared with a back panel system.

Furthermore, since the through-holes for getting screws thereinto in the lower-side printed boards are provided at the same positions as those in the upper-side printed boards, it is possible to have the printed board drawings for commomrn use with respect to both the main control unit (printed board 1P) and the development unit (printed board 3P), and with respect to both the communication control unit (printed board 2P) and the image processing unit (printed board 4P). As a result, it is possible to improve an efficiency in the designing.

Additionally, since the coupling fittings 7 are provided with the openings 70 to 73 for connectors for effecting a connection to the outside of the apparatus, they can be disposed along the end portions of each printed board. This contributes to an increase in the component mounting space.

Although, in the above embodiments, the image control apparatus and the printed boards constituting the same have been explained in the form of the controller for a printer, this is not restrictive. For example, the present invention is also adaptable to an image controller such as a copying machine, a facsimile, or the like. Also, the image processing unit 4 is an optional component and thus it is not necessarily provided. Furthermore, although, in the above mounting structure, the number of the printed boards used therein is four, the number of printed boards to be used is not restrictive to four.

Although the present invention has been disclosed and described by way of two embodiments, it is apparent to those skilled in the art that other embodiments and modifications of the present invention are possible without departing from the essential features thereof.

We claim:

1. An image control apparatus, comprising:
    a communication control unit for effecting communication with the outside of the apparatus;
    an image processing control unit for controlling processings required for given image data;
    a main control unit for controlling the communication control unit and the image processing control unit;
    a first printed board mounting thereon said communication control unit;
    a second printed board mounting thereon said image processing control unit;
    a third printed board mounting thereon said main control unit;
    a first connector for connecting and disconnecting said first printed board and said third printed board;
    each of the communication control unit and the image processing control unit including a control register and an acknowledgment circuit,
    wherein said main control unit includes a connector that is coupled in a lateral direction to a corresponding connector of said communication control unit, said main control unit further including another connector that is coupled to a corresponding connector of a development unit in an up-and-down direction, said development unit having another connector that is coupled in a lateral direction to a corresponding connector of said image processing control unit.

2. An image control apparatus as set forth in claim 1, wherein the main control unit includes a main processor for the image control, a loader ROM for data-loading, a control storage, a control register, a driver/receiver for an operation panel, and a control circuit for an external memory.

3. An image control apparatus as set forth in claim 2, wherein load programs for a main program and a diagnostic program are stored in advance in the loader ROM.

4. An image control apparatus as set forth in claim 2, wherein the operation panel includes a liquid crystal display, lamps and switches provided thereon, and further includes a controller for driving the liquid crystal display, a display buffer for the controller, a lamp register for the lamps, a switch register for the switches, an acknowledgement circuit for sending an acknowledgement signal back to the main control unit, and an interruption register.

5. An image control apparatus as set forth in claim 1, wherein the image processing control unit comprises a development unit for developing the given image data and an image processing unit for controlling compression or expansion of the given image data.

6. An image control apparatus as set forth in claim 5, wherein the development unit comprises a printer control circuit, a bit map memory, and a character generator ROM.

7. An image control apparatus having a communication control unit, an image processing control unit, and a main control unit for controlling the communication control unit and the image processing control unit, said image control apparatus comprising:

a lower-side unit including at least one rectangular printed board on which one of said control units is mounted, the at least one printed board having a first connector and a plurality of through-holes provided along an end portion thereof;

an upper-side unit including at least one other rectangular printed board on which another one of said control units is mounted, the at least one other printed board having a second connector connectable to the first connector and a plurality of through-holes provided along an end portion thereof, one of said side units having at least two of said printing boards;

coupling fittings for coupling the lower-side unit to the upper-side unit, the coupling fittings having a plurality of holes for fitting screws thereinto, and openings enabling at least one of the communication control unit, image processing control unit, and main control unit mounted on three printed boards, respectively, to be connected to a connector for effecting a connection to an external device other than said control units;

the plurality of holes of the coupling fittings being formed at positions corresponding to the respective through-holes provided in each printed board of the lower-side unit and the upper-side unit, when the lower-side unit and the upper-side unit are connected to each other by the first and second connectors, screws fit into the plurality of holes of the coupling fittings via the respective through-holes from the outside of each printed board of the lower-side unit and the upper-side unit, wherein said main control unit includes a connector that is coupled in a lateral direction to a corresponding connector of said communication control unit, said main control unit further including another connector that is coupled to a corresponding connector of a development unit in an up-and-down direction, said development unit having another connector that is coupled in a lateral direction to a corresponding connector of said image processing control unit.

8. An image control apparatus as set forth in claims 7, wherein each of the lower-side unit and the upper-side unit includes at least two of said printed boards.

9. An image control apparatus, comprising:

a communication control unit for effecting communication with the outside of the apparatus;

an image processing control unit for controlling processings required for given image data;

a main control unit for controlling the communication control unit and the image processing control unit;

a first printed board mounting thereon said communication control unit;

a second printed board mounting thereon said image processing control unit;

a third printed board mounting thereon said main control unit;

a first connector for connecting and disconnecting said first printed board and said third printed board;

each of the communication control unit and the image processing control unit including an acknowledgment circuit, wherein said main control unit includes a connector that is coupled in a lateral direction to a corresponding connector of said communication control unit, said main control unit further including another connector that is coupled to a corresponding connector of a development unit in an up-and-down direction, said development unit having another connector that is coupled in a lateral direction to a corresponding connector of said image processing control unit.

10. An image control apparatus as set forth in claim 9, wherein the main control unit includes a main processor for the image control, a loader ROM for data-loading, a control storage, a control register, a driver/receiver for an operation panel, and a control circuit for an external memory.

11. An image control apparatus as set forth in claim 10, wherein load programs for a main program and a diagnostic program are stored in advance in the loader ROM.

12. An image control apparatus as set forth in claim 10, wherein the operation panel includes a liquid crystal display, lamps and switches provided thereon, and further includes a controller for driving the liquid crystal display, a display buffer for the controller, a lamp register for the lamps, a switch register for the switches, an acknowledgment circuit for sending an acknowledgment signal back to the main control unit, and an interruption register.

13. An image control apparatus as set forth in claim 9, wherein the image processing control unit comprises a development unit for developing the given image data and an image processing unit for controlling compression or expansion of the given image data.

14. An image control apparatus as set forth in claim 13, wherein the development unit comprises a printer control circuit, a bit map memory, and a character generator ROM.

15. An image control apparatus, comprising:

a communication control unit for effecting communication with the outside of the apparatus;

an image processing control unit for controlling processings required for given image data; and a main control unit for controlling the communication control unit and the image processing control unit;

each of the communication control unit and the image processing control unit including an acknowledgment circuit for sending an acknowledgment signal back to the main control unit;

a first printed board mounting thereon said communication control unit;

a second printed board mounting thereon said image processing control unit;

a third printed board mounting thereon said main control unit;

a first-side unit including at least one of said rectangular printed boards, the at least one printed board having a first connector and a plurality of through-holes provided along an end portion thereof;

a second-side unit including at least one other of said rectangular printed boards, the at least one other printed board having a second connector connectable to the first connector and a plurality of through-holes provided along an end portion thereof, one of said side units having at least two of said printing boards;

coupling fittings for coupling the first-side unit to the second-side unit, the coupling fitting having a plurality of holes for fitting screws thereinto, and openings enabling at least one of the communication control unit, image processing control unit, and main control unit mounted on three printed boards, respectively, to be connected to a connector for effecting a connection to an external device other than said control units;

the plurality of holes of the coupling fittings being formed at positions corresponding to the respective through-holes provided in each printed board of the first-side unit and the second-side unit, when the first-side unit and the second-side unit are connected to each other by the first and second connectors, screws it into the plurality of holes of the coupling fittings via the respective through holes from the outside of each printed board of the first-side unit and the second-side unit, wherein said main control unit includes a connector that is coupled in a lateral direction to a corresponding connector of said communication control unit, said main control unit further including another connector that is coupled to a corresponding connector of a development unit in an up-and-down direction, said development unit having another connector that is coupled in a lateral direction to a corresponding connector of said image processing control unit.

16. An image control apparatus as set forth in claim 15, wherein the main control unit includes a main processor for the image control, a loader ROM for data-loading, a control storage, a control register, a driver/receiver for an operation panel, and a control circuit for an external memory.

17. An image control apparatus as set forth in claim 16, wherein load programs for a main program and a diagnostic program are stored in advance in the loader ROM.

18. An image control apparatus as set forth in claim 16, wherein the operation panel includes a liquid crystal display, lamps and switches provided thereon, and further includes a controller for driving the liquid crystal display, a display buffer for the controller, a lamp register for the lamps, a switch register for the switches, an acknowledgment circuit for sending an acknowledgment signal back to the main control unit, and an interruption register.

19. An image control apparatus as set forth in claim 15, wherein the image processing control unit comprises a development unit for developing the given image data and an image processing unit for controlling compression or expansion of the given image data.

20. An image control apparatus as set forth in claim 15, wherein the development unit comprises a printer control circuit, a bit map memory, and a character generator ROM.

21. An image control apparatus having a communication control unit, an image processing control unit, and a main control unit for controlling the communication control unit and the image processing control unit, said image control apparatus comprising:

a lower-side unit including at least one rectangular printed board on which one of said control units is mounted, the at least one printed board having a first connector and a plurality of through-holes provided along an end portion thereof;

an upper-side unit including at least one other rectangular printed board on which another one of said control units is mounted, the at least one other printed board having a second connector connectable to the first connector and a plurality of through-holes provided along an end portion thereof, one of said side units having at least two of said printed boards; and coupling fittings for coupling the lower-side unit to the upper-side unit, a first one of the coupling fittings being provided at an end portion of said lower-side unit, a second one of the coupling fittings being provided at an opposite end portion of said lower-side unit, at least one of the coupling fittings having an opening for a connector for effecting a connection to an external device outside the image control apparatus, wherein said main control unit includes a connector that is coupled in a lateral direction to a corresponding connector of said communication control unit, said main control unit further including another connector that is coupled to a corresponding connector of a development unit in an up-and-down direction, said development unit having another connector that is coupled in a lateral direction to a corresponding connector of said image processing control unit.

* * * * *